United States Patent [19]

Gailus

[11] Patent Number: 5,041,793
[45] Date of Patent: Aug. 20, 1991

[54] CONTROLLED SLEW RATE AMPLIFIER

[75] Inventor: Paul H. Gailus, Prospect Heights, Ill.

[73] Assignee: Motorola, Inc., Schaumburg, Ill.

[21] Appl. No.: 606,646

[22] Filed: Oct. 31, 1990

[51] Int. Cl.[5] .............................................. H03G 3/30
[52] U.S. Cl. ...................................... 330/2; 330/129;
375/39
[58] Field of Search .................. 307/540, 542, 546;
330/2, 129, 149, 278; 332/103, 105; 375/39

[56] References Cited

U.S. PATENT DOCUMENTS

| 4,048,573 | 9/1977 | Evans et al. | 330/2 |
| 4,318,053 | 3/1982 | Sondermeyer | 330/2 X |
| 4,718,036 | 1/1988 | Halbert et al. | 375/28 X |
| 4,926,443 | 5/1990 | Reich | 375/39 X |

Primary Examiner—Steven Mottola
Attorney, Agent, or Firm—Joseph P. Krause

[57] ABSTRACT

An adjustable slew rate amplifier in the input stage of an amplifier circuit helps reduce off-channel frequency splatter. In instances where test sequences are input to an amplifier circuit that are used to measure maximum permissible input levels to the amplifier, inclusion of a low slew rate amplifier in the input loop further prevents the production of off-channel frequency splatter caused even by the input test sequence. The adjustable slew rate amplifier is run at full slew rate, providing full-bandwidth amplification, during periods of normal circuit operation.

26 Claims, 2 Drawing Sheets

CONTROLLED SLEW RATE AMPLIFIER

TECHNICAL FIELD

This invention relates generally to linear amplifier circuits. In particular, this invention relates to negative feedback linear amplifier circuits that adjust input signal levels to maximize output power and efficiency while preventing output signal distortion caused by over driving the amplifier stage.

BACKGROUND OF THE INVENTION

Electronic amplifier circuits are well known in the art. These devices employ various techniques to improve their linearity. There is often a need to maximize output power and efficiency of a linear amplifier circuit by providing sufficient input drive signal levels. However, with any given amplifier there is a drive level beyond which linearity is severly degraded. When overdriven by an input signal most amplifier circuits will inherently generate undesired signals as either adjacent channel frequency splatter or other unwanted signals.

Electronic amplifier circuits that run in Class B or AB are desirable because of their relatively high efficiency and are somewhat linear but require negative feedback to obtain the improved linearity demanded by many applications. Reducing output signal distortion or frequency splatter in a class B or class AB amplifier might permit use of these amplifiers in communications applications requiring relatively distortion-free amplification. Negative feedback reduces distortion as long as the amplifier is not overdriven. Since negative feedback actually increases distortion and unwanted signals when the amplifier is overdriven, it is important to prevent an amplifier from being overdriven.

In many communications applications, adjacent channel frequency splatter caused by an overdriven final amplifier stage in a radio transmitter causes undesirable interference with adjacent channel users. In such applications, which may be typically employed in digital or analog communications systems using signals with a time-varying amplitude, a test signal might be used to determine the maximum allowable input level to the final amplitude stage in order to prevent the final amplifier from being overdriven. In instances where an input test sequence is used to determine the maximum input level to an amplifier, even the input test sequence may cause undesirable adjacent frequency splatter at the instant that the amplifier's maximum drive level has been reached.

As an input signal to an amplifier increases in amplitude, an ideal outptu amplifier circuit would track changes in the input level and amplify the input level producing a substantially exact copy of the input signal. Practical limitations of an electronic amplifier limit the ability of a circuit to infintely follow input signal levels. As an iput signal level increases to the point where the output amplifier stage can no longer amplify it accurately, the output stage will begin to saturate and, if the amplifier's output signal is fed back to the input in a negative feedback loop, an algebraic addition of the amplifier's input signal with its feedback error signal, can produce substantial distortion in the signal input to the amplifier stage.

In some communications applications, it may be desirable to limit the amount of frequency splatter caused by overdriving an amplifier, even during intervals when the maximum input level for the amplifier is being determined by a test sequence. An amplifier circuit that includes the ability to limit adjacent frequency splatter even when a maximum drive level is being measured by a test sequence would be an improvement over the prior art.

SUMMARY OF THE INVENTION

There is provided herein an amplifier circuit that reduces off-channel frequency splatter caused by excessive input signal levels, including off-channel splatter caused by inpu test signals used to established maximum input signal levels. The amplifier circuit in the preferred embodiment is comprised of an inverting amplifier stage, a feedback circuit that samples the output of the amplifier and couples a portion of the output signal back to the amplifiers input, and an adjustable slew rate amplifier coupled between the amplifier stage input and the input signal source, the slew rate of which is reduced during periods when input level test sequences are input to the amplifier circuit. (The test sequences are typically slow rise time signals or voltage ramps used to establish a maximum input level.)

The adjustable slew rate amplifier has its slew rate, limited or controlled during periods when a test signal is being input to the amplifier stage to determine the maximum input signal level which the amplifier stage can accept without clipping. The adjustable slew rate amplifier reduces off-channel splatter from the amplifier caused by its being overdriven by the test sequences by virtue of its ability to suppress signals being input to the amplifier that exceed the amplifiers ability to follow the rise time of the signals.

At least two different slew rates are established under the control of an external circuit. In an operational mode the slew rate amplifier has a maximum slew rate that is capable of accurately tracking the rise time of input signal levels experienced under normal operating conditions. In its limited slew rate mode, entered when input test signals that have typically slow rise times are being input to the amplifier, the reduced slew rate of the amplifier is sufficient to follow the input test signal but is suppresses undesirable emission from the amplifier when overdrive occurs.

DETAILED DESCRIPTION OF THE PREFERRED EMBODIMENT

Figure 1:
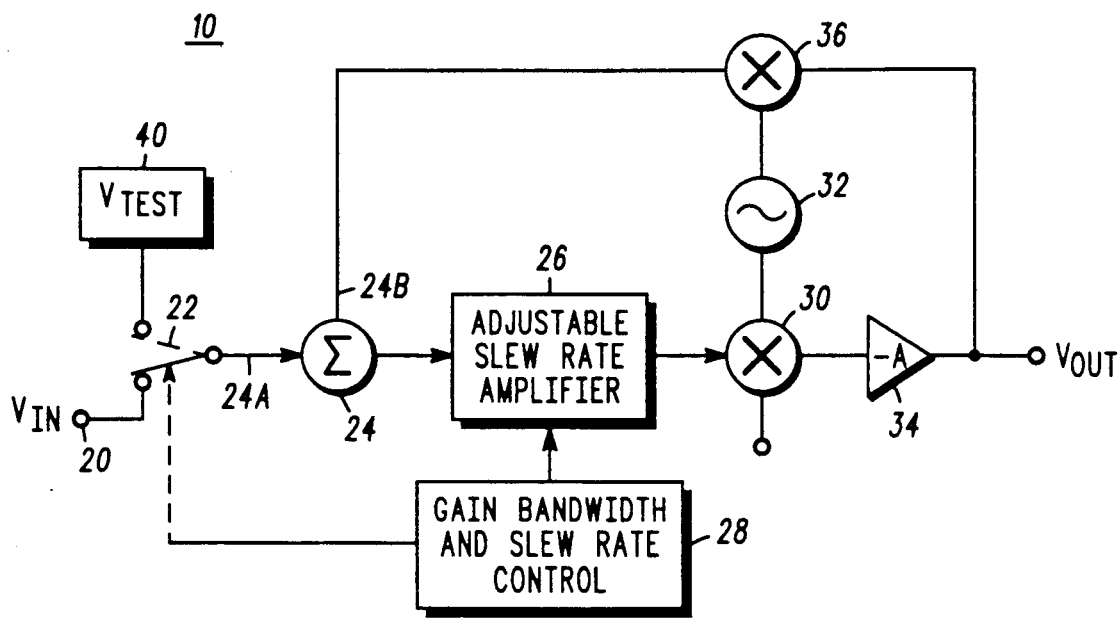
FIG. 1 shows a block diagram of an amplifier circuit providing reduced off-channel frequency splatter.

FIG. 1 shows a simplified block diagram of an amplifier circuit (10) that provides reduced off-frequency splatter that may be caused by clip detection sequences input to an amplifier to determine its maximum allowable drive level. In the amplifier circuit (10) shown in FIG. 1, an input signal (20) from an external source, such as an audio modulator or other source is coupled to a first input (24A) of a summing network (24) through a selection switch (22). The output of the summer (24) is coupled to an adjustable slew rate amplifier (26) which, in its normal operational mode, has a maximum slew rate sufficient to accommodate the rise time of the signals from the signal source (20).

As seen in FIG. 1, the output of the adjustable slew rate amplifier (26) is coupled to a first multiplier, (also known as a mixer and which in FIG. 1 is a two-input mixer) circuit (30), the other output of which is coupled to the output of a local oscillator (32) (not shown). The multiplier circuit (30) mixes or heterodynes the output of the adjustable slew rate amplifier to a frequency equal to the sum (or difference depending upon the desired product frequency) of the local oscillator frequency and the frequency of the output of the adjustable slew rate amplifier (26).

The output of the multiplier circuit (30) is amplified by an inverting amplifier stage (34) to produce an output voltage $V_{out}$. The output signal of the inverting amplifier stage (34) might be coupled to an antenna, for example; it might also be coupled to subsequent signal processing stages as required by the particular application considered for the amplifier circuit (10).

In the amplifier circuit shown in FIG. 1, the output of the inverting amplifier stage (34) is coupled to a second multipler, stage (36) (also known as a mixer) the other input of which receives the local oscilaltor signal (32). The second multiplier stage (36) heterodynes the outptu of the inverting amplifier stage (34) by the same local oscillator signal from the local oscillator (32) to produce the baseband signal input to the adjustable slew rate amplifier (26) from the summing node (24). The output of the second multiplier stage (36) is coupled to the second input (24B) of the summing network (24).

(The embodiment shown contemplates being used in a radio. Alternate embodiments of the invention might not use the single frequency conversion shown in FIG. 1 but might use multiple conversion. Still other embodiments of the invention might not use any frequency conversion in the amplifier circuit shown and perform essentially all functions at a single frequency, baseband for example.)

The summing network (24) produces at an output, a signal that is substantially the algebraic sum of the first input (24A) and the second input (24B). Since the final amplifier stage (34) is an inverting amplifier, the algebraic addition of the signal at input (24A) and the addition of the signal (24B) produces as a net result, a subtraction of these two signals. The output from the summer (24) can be through of as an error signal which is amplified by the adjustable slew rate amplifier (26). If the input signal to the adjustable slew rate amplifier (26) has a slew rate or rise time that exceeds the ability of the adjustable slew rate amplifier to follow it, the adjustable slew rate amplifier will limit the slew rate time of the signal input to the first multiplier (30), to the maximum slew rate capability of the slew rate amplifier.

The maximum slew rate of the adjustable slew rate amplifier (26) is substantially reduced under the control of the gain bandwidth and slew rate control circuit (28) during times when a test signal from a test signal source (40) is switched into the summing network (24) by means of the source selector switch (22). The test signal is used to establish the maximum input level that the amplifier circuit (10) can accept at the first input (24A) of the summing network (24).

The maximum input signal level that the amplifier circuit (10) can accurately reproduce can be determined by putting a slow rise time signal from the test signal source (40) that increases slowly to a point at which the output from the inverting amplifier stage (34) begins to saturate or clip. When this maximum input signal level is reached, its determination can thereafter be used to limit in put signal excursion from the signal source (20) to eliminate distortion or splatter caused by overdriving the amplifier stage (34).

During the time that the test signal from the test signal source (40) is being input to the summing network (24) adjacent or off-channel frequency splatter caused by clipping of the amplifier can be avoided by reducing the slew rate of the adjustable slew rate amplifier (26). Adding the adjustable slew rate amplifier and reducing its slew rate during instances when the input drive level are being measured virtually precludes the generation of any off-channel frequency splatter, even during input test sequences to the amplifier, which can cause clipping. In this manner very clear signal sources can be maintained in communication systems that require minimal adjacent channel interference.

Figure 2:
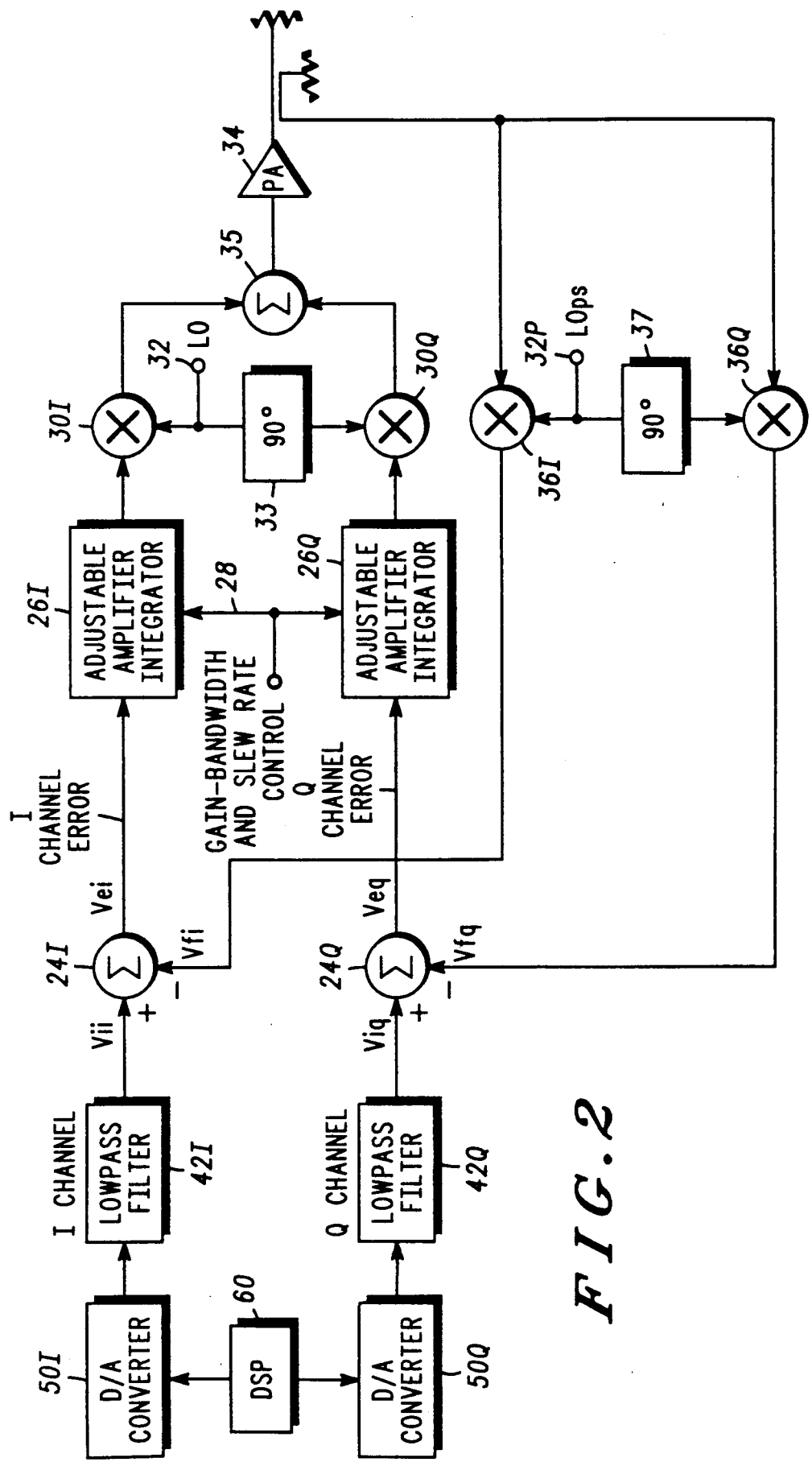
FIG. 2 shows a block diagram of an amplifier providing reduced off-channel frequency splatter for use with quadrature amplitude signals.

FIG. 2 shows a block diagram of another application of the preferred embodiment of the amplifier circuit that reduces off-channel frequency splatter, including off-channel frequency splatter caused by clip detection sequences. In this figure the amplifier circuit, a so-called quadrature amplifier, amplifies an in-phase component designated as I-chahnel as well as a quadrature component designated as Q-channel. (The I and Q signal components are baseband signals, which are used to scale the magnitudes of local oscillator signals that are ninety degrees apart from each other. The I and Q signals as well as the phase or frequency of the local oscillator can be used to carry information.)

In this figure, a digital signal processor controls digital to analog convertors 50I and 50Q, respectively, that generate the input information signals for a communications device such as a radio transmitter. The output of the digital to analog convertors 50I and 50Q are both low-pass-filtered in I channel and Q channel low pass filters 42I and 42Q. The output of the low pass filters for the I channels and Q channels are both input to I channel and Q channel summing circuits 24I and 24Q respectively. The output of these summing circuits are coupled to I channel and Q channel adjustable slew rate amplifier circuits (26I and 26Q). Both of these adjustable slew rate amplifiers (26I and 26Q) are controlled by a gain bandwidth slew rate control circuit (28) not shown in FIG. 2. (The slew rate control circuit (28) might include a microprocessor or other circuitry capable of determining when the slew rate of the adjustable slew rate amplifiers is to be reduced.)

As shown in FIG. 1, the output of these adjustable slew rate amplifiers (26I and 26Q) are both coupled into multiplier circuits (30I and 30Q). These two multiplier circuits both obtain their heterodyning frequencies from a local oscillator (32) (not shown in FIG. 2) the quadrature or Q component of which is generated by phase shifting the local oscillator signal by ninety degrees in a phase shifting network (33).

The output of both the I channel and Q channel multiplier circuits (30I and 30Q) are summed in a summing network (35) the output of which is amplified by the final amplifier stage (34), similar to the implementation shown in FIG. 1.

In FIG. 2 the output of the final amplifier stage (34) is sampled and returned to two multiplier circuits (36I and 36Q) which restore the output of the final amplifier stage (34) to baseband frequencies by multiplying the amplifier output signals by a second local oscillator signal 32P that has been phase shifted from the local oscillator signal 32 for loop stability (one copy of signal 32P is also phase shifted by 90 degrees to return the Q channel component back to baseband). The negative feedback loop of the quadrature amplifier is completed by connecting the fedback signals from the multipliers (36I and 36Q) to the second inputs of the I channel and Q channel first summers (24I and 24Q).

In communications applications that require multi-level QAM or quadrature amplitude modulation signals, or other variable amplitude signals, such as single sideband, the amplifier circuit shown in FIG. 2 can reduce off-channel frequency splatter even caused by clip detection sequences as described above. When a clip detection sequence is input at summing networks 24I and 24Q, which test sequence is typically comprised of a slow rise time ramp voltage, the slew rate of the adjustable amplifiers (26I and 26Q) is reduced to suppress the generation of harmonics or spurious signals caused by a test sequence that rises beyond the point at which the final amplifier stage (34) can accurately amplify it.

Figure 3:
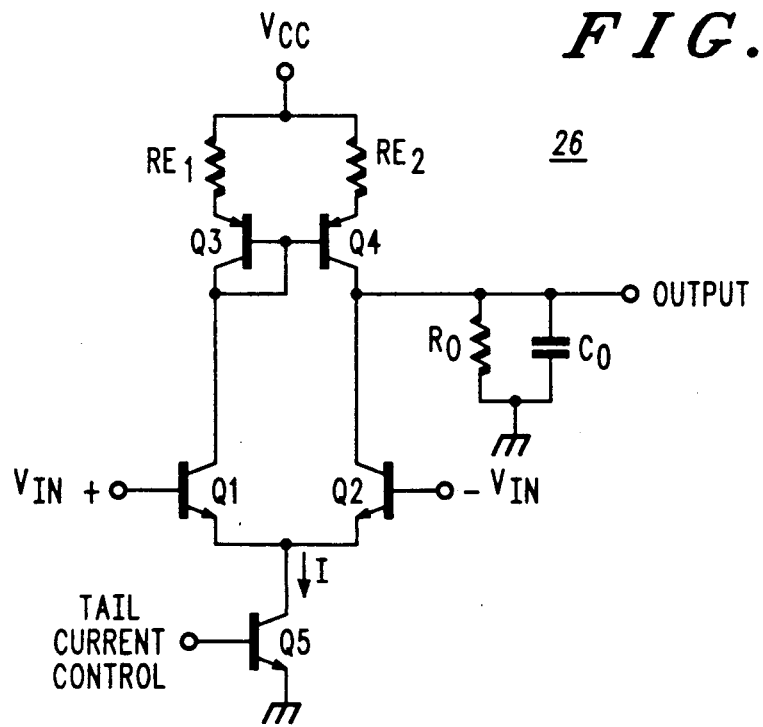
FIG. 3 shows a schematic diagram of an adjustable slew rate amplifier contemplated in FIG. 1 and FIG. 2.

An adjustable slew rate amplifier used in FIGS. 1 and 2 is shown in FIG. 3. The adjustable slew rate amplifier (26) mayb e considered as a voltage to current convertor or a transconductance amplifier, the output of which is shunted by an RC network.

Slew rate adjustment is achieved by means of adjusting the tail current I through the constant current source transistor $Q_5$. $Q_1$ and $Q_2$ form a differential pair. $Q_3$ and $Q_4$ form a current mirror to provide an active load for the collectors of $Q1$ and $Q2$. If the collector current through $Q_5$ is established to be relatively large, both $Q_1$ and $Q_2$ may conduct fairly heavily through $Q_3$, $Q_4$, respectively. (RE1 and RE2 may be selected to limit the amount of collector current and increase the output impedance of the active load.)

When the collector current (I) through $Q_5$ is relatively large the voltage swing on the inverting and non-inverting terminals $V_{IN-}$ and $V_{IN+}$ may swing relatively freely with the resultant output current at the collectors of $Q_4$ and $Q_2$ swinging between $-I$ and $+I$ where I is the value of current through $Q_5$. As the rate of change of output voltage across the capacitor is equal to 1/C times the current through the capacitor, a relatively large collector current through $Q_5$ will permit the output voltage across the capacitor $C_0$ to change very quickly.

If the collector current I through $Q_5$ is made relatively small, the maximum rate of change of the output voltage, also known as the slew rate, will also be small, regardless of the input signal excursion across the bases of $Q_1$ and $Q_2$.

It should be seen that an adjustable slew rate amplifier has been shown which when incorporated into a signal loop of an amplifier stage can be used to reduce adjacent channel frequency splatter when the maximum input level signals that the amplifier can amplify is being measured during test signals. In this fashion, even test sequence frequency splatter can be reduced further improving or reducing off-channel interference in radio communication systems that require precise splatter control.

Although an inverting amplifier is shown in FIG. 1, alternate embodiments might include using a non-inverting gain stage for the amplifier (34). Using a non-inverting amplifier would thereafter require using some other signal inversion means, such as an inverting voltage amplifier or inverting operational amplifier, between the output of the amplifier (34) and the secon input (24B) of the summer (24) so as to produce a difference signal output from the summer (24). Furthermore, the amplifier (34) need not provide voltage amplification but might provide current gain if an appropriate output load is selected. Alternate embodiments might also contemplate using a voltage or current follower as the final amplifier (34) so long as a negative feedback signal is provided to the summer circuits (24, or 24I and 24Q).

What is claimed is:

1. In an amplifier circuit providing signals at a circuit output node that are amplified versions of signals at a circuit input node, the amplifier circuit having at least one internal signal amplifier stage with an input and an output, providing signals at its output that are inverted versions of signals at its input, a method of limiting spurious signals from the output of the amplifier circuit caused by overdriving the internal signal amplifier stage during the input of predetermined rise time clip detection input signal test sequences that are input to the amplifier circuit, said method comprised of the steps of:

sampling the output signal from the amplifier circuit to provide a feedback signal;

adding the feedback signal to the predetermined rise time clip detection input signal test sequences to produce an error signal;

testing the error signal to identify internal signal amplifier stage output signal clipping; and amplifying the error signal in an adjustable slew rate amplifier, having at least first and second slew rates determined by a control signal to the adjustable slew rate amplifier, to produce an input signal for the one internal signal amplifier stage so as to limit undesirable signal components from the output of the amplifier during input of the predetermined rise time clip detection input signal test sequences.

2. An amplifier circuit that reduces off-channel frequency splatter caused by excessive input signal levels, by establishing input signal levels at which clipping might occur using predetermined rise-time test signals comprised of:

an inverting amplifier means, having an input and an output, for providing output signals at the output that are at least inverted versions of signals at the input;

sampling means, having an input and an output, the input coupled to the output of the amplifier means, for providing a feedback signal at the output that is a portion of the output signals of the amplifier means;

summing means, having at least first and second inputs, and an output, for providing a signal at the output that is substantially an algebraic summation of signals at the first and second inputs, said first input of the summing means being coupled to the output of the sampling means, said second input being coupled to a signal source to be amplified by the amplifier circuit;

adjustable slew rate amplifier means having an input and an output, for providing at least first and second amplifier slew rates during predetermined intervals in response to a slew rate control signal, said input coupled to the output of the summing means, said output coupled to the input of the amplifier means; and slew rate control means coupled to the adjustable slew rate amplifier means for providing a control signal to the adjustable slew rate amplifiers.

3. The amplifier circuit of claim 2 where said inverting amplifier is a voltage amplifier.

4. The amplifier circuit of claim 2 where said sampling means is a feedback circuit.

5. The amplifier circuit of claim 2 where said sampling means includes a two-input signal mixer, mixing signals output from the inverting amplifier with a local oscillator signal.

6. The amplifier circuit of claim 2 where said adjustable slew rate amplifier means includes a transconductance amplifier.

7. The amplifier circuit of claim 2 where said inverting amplifier is a current amplifier.

8. The amplifier circuit of claim 2 where said slew rate control means is a microprocessor.

9. The amplifier circuit of claim 2 where said inverting amplifier includes a two input signal mixer, multiplying signals output from the adjustable slew rate amplifier means by a local oscillator signal.

10. An amplifier circuit providing reduced off-channel frequency splatter caused by clip detection test sequences comprised of:
   an amplifier, having an input and output, providing output signals at the output that are versions of signals at the input;
   sampling means, having an input and an output, the input coupled to the output of the amplifier means, for providing a feedback signal that is a fractional portion of the output signals of the non-inverting amplifier;
   summing means, having at least first and second inputs, and an output, for providing a signal at the output that is substantially an algebraic summation of signals at the first and second inputs, said first input of the summing means being coupled to the output of the sampling means, said second input being coupled to a signal source to be amplified by the amplifier;
   inverted means, having an input and an output, for providing signals at the output that are inverted versions of signals at the input, said inverter means being operationally coupled between the output of the sampling means and the first input of the summing means;
   adjustable slew rate amplifier means having an input and an output, for providing at least first and second amplifier slew rates during predetermined intervals in response to a slew rate control signal, said input coupled to the output of the summing means, said output coupled to the input of the amplifier; and
   slew rate control means coupled to the adjustable slew rate amplifier means for providing a control signal to the adjustable slew rate amplifiers means.

11. The amplifier circuit of claim 10 where said amplifier is a non-inverting voltage amplifier.

12. The amplifier circuit of claim 10 where said amplifier is a current amplifer.

13. The amplifier circuit of claim 10 where said sampling means includes a mixer circuit.

14. The amplifier circuit of claim 10 where said sampling means includes a feedback circuit.

15. The amplifier circuit of claim 10 where said inverter means is a voltage inverter.

16. The amplifier circuit of claim 10 where said adjustable slew rate amplifier means is a transconductance amplifier.

17. The amplifier circuit of claim 10 where said slew rate control means is a microprocessor.

18. The amplifier circuit of claim 10 further including a mixer circuit coupled between the output of the adjustable slew rate amplifier means and the input of the amplifier, said mixer circuit multiplying signals output from said adjustable slew rate amplifier means by a signal from a local oscillator.

19. A phase quadrature amplifier circuit for amplifying signals with in-phase (I) and quadrature (Q) components and that reduces off-channel frequency splatter caused by excessive I and Q input signal levels, by establishing I and Q input signal levels at which clipping might occur using predetermined rise-time test signals comprised of:
   an inverting amplifier means, having an input and an output, for providing output signals at the output that are at least inverted versions of signals at the input;
   channel sampling means, having an input and at least an I-channel output and a Q-channel output, the input coupled to the output of the amplifier means, for providing I and Q feedback signals at the I and Q outputs that are proportional to the output signals of the amplifier means;
   I-signals summing circuit, having at least a first and a second input and an output, providing a signal at the output that is substantially an algebraic summation of signals at the first and second inputs, said first input of the I-signal summing circuit being coupled to the I output of the channel sampling means, said second input being coupled to an I-channel signal source to be amplified by the amplifier circuit;
   Q-signal summing circuit, having at least a first and second input, and an output, providing a signal at the output that is substantially an algebraic summation of signals at the first and second inputs, said first input of the Q-signal summing circuit being coupled to the Q output of the channel sampling means, said second input being coupled to a Q-channel signal source to be amplified by the amplifier circuit;
   I-channel adjustable slew rate amplifier means having an input and an output, for providing at least first and second amplifier slew rates during predetermined intervals in response to a slew rate control signal, said input coupled to the output of the I-signal summing circuit, said output coupled to the input of the amplifier means;
   Q-channel adjustable slew rate amplifier means having an input and an output, for providing at least first and second amplifier slew rates during predetermined intervals in response to a slew rate control signals, said input coupled to the output of the Q-signal summing circuit, said output coupled to the input of the amplifier means; and
   slew rate control means, coupled to the I-channel and Q-channel adjustable slew rate amplifier means for providing a control signal to the adjustable slew rate amplifiers.

20. The amplifier circuit of claim 19 where said inverting amplifier means is a voltage amplifier.

21. The amplifier circuit of claim 19 where said inverting amplifier means is a current amplifier.

22. The amplifier circuit of claim 19 where said channel sampling means includes a mixer circuit.

23. The amplifier circuit of claim 19 where said inverting amplifier means includes a mixer circuit.

24. The amplifier circuit of claim 19 where said I-channel adjustable slew rate amplifier means is a transconductance amplifier.

25. The amplifier circuit of claim 19 where said Q-channel adjustable slew rate amplifier means is a transconductance amplifier.

26. The amplifier circuit of claim 19 where said slew rate control means is a microprocessor.

* * * * *